United States Patent [19]

Goodman et al.

[11] Patent Number: 4,587,713

[45] Date of Patent: May 13, 1986

[54] METHOD FOR MAKING VERTICAL MOSFET WITH REDUCED BIPOLAR EFFECTS

[75] Inventors: Lawrence A. Goodman, Plainsboro; Alvin M. Goodman, Princeton Township, Mercer County, both of N.J.

[73] Assignee: RCA Corporation, Princeton, N.J.

[21] Appl. No.: 582,601

[22] Filed: Feb. 22, 1984

[51] Int. Cl.$^4$ .......................................... H01L 29/78
[52] U.S. Cl. .................................. 29/576 B; 29/571; 29/577 C; 148/1.5; 148/187; 357/23.4
[58] Field of Search ................... 148/1.5, 187; 29/571, 29/576 B, 577 C; 357/23.4

[56] References Cited

U.S. PATENT DOCUMENTS

| | | | |
|---|---|---|---|
| 4,055,884 | 11/1977 | Jambotkar | 29/571 |
| 4,072,975 | 2/1978 | Ishitani | 357/23 |
| 4,145,700 | 3/1979 | Jambotkar | 357/23 |
| 4,297,718 | 10/1981 | Nishizawa | 357/22 |
| 4,344,081 | 8/1982 | Pao et al. | 357/43 |
| 4,364,073 | 12/1982 | Becke et al. | 357/23 |
| 4,374,455 | 2/1983 | Goodman | 29/571 |
| 4,455,565 | 6/1984 | Goodman et al. | 357/23.4 |
| 4,466,175 | 8/1984 | Coe | 29/571 |

FOREIGN PATENT DOCUMENTS

| | | | |
|---|---|---|---|
| 0023277 | 2/1977 | Japan | 357/23.4 |
| 2062349 | 5/1981 | United Kingdom | 357/23 UD |

OTHER PUBLICATIONS

"A Highly Reliable 16 Output High Voltage NMOS-/CMOS Logic IC with Shielded Source Structure", H. Wakaumi et al., Proceedings of IEDM Meeting held in Washington, D.C., Dec. 1983, pp. 416–419.

"Parasitic Effect-Free, High Voltage MOS ICs with Shielded Source Structure", H. Sakuma et al., Proceedings of IEDM Meeting held in San Francisco, California, Dec. 1982, pp. 254–257.

*Primary Examiner*—Upendra Roy
*Attorney, Agent, or Firm*—Birgit E. Morris; Donald S. Cohen; Kenneth R. Glick

[57] ABSTRACT

A vertical MOSFET device includes a semiconductor wafer having source, body and drain regions of alternate conductivity type disposed therein. The source and drain regions are located so as to define the length and width of a channel region in the body region at a surface of the wafer. The body region further includes a similar conductivity type supplementary region having a relatively high areal dopant concentration. The supplementary region, which can be fabricated by ion implantation, extends laterally beneath a portion of the channel region. A source electrode is disposed on one wafer surface and a drain electrode is disposed on an opposing wafer surface.

7 Claims, 3 Drawing Figures

METHOD FOR MAKING VERTICAL MOSFET WITH REDUCED BIPOLAR EFFECTS

The present invention relates to vertical field effect transistors (FETs) such as vertical metal oxide semiconductor FETs (MOSFETs). More particularly, the invention relates to vertical, double diffused MOSFET (VDMOS) devices having source and gate electrodes on one surface of a semiconductor wafer and a drain electrode on an opposing surface of the wafer. Furthermore, the invention relates to VDMOS devices which incorporate three or four semiconductor layers.

BACKGROUND OF THE INVENTION

A VDMOS device incorporates a semiconductor wafer in which source, body and drain regions of alternate conductivity type are disposed in series. The body region is disposed adjacent to a wafer surface, and the source and drain regions are located so as to define the length and width of a channel region in the body region at that surface. An insulated gate electrode is disposed on the wafer surface over the channel region.

During device operation, an appropriate voltage on the gate electrode inverts the conductivity type of the body region in that portion of the channel region that is contiguous with the wafer surface; so as to form an inversion channel contiguous with the wafer surface. The remainder of the channel region comprises a depletion region which is associated with this inversion channel. For a particular device structure, the depth of the depletion region portion of the channel region is determined by the magnitude of the voltage applied to the gate electrode, and the inversion channel permits current flow between the source and drain regions. Thus, device operation is described as being unipolar in nature, with electron or hole flow being selectively modulated by an applied voltage to the gate. A conventional VDMOS structure is further described in U.S. Pat. No. 4,145,700, POWER FIELD EFFECT TRANSISTORS, C. J. Jambotkar, Mar. 20, 1979.

Inherent in the source/body/drain structure of a VDMOS device is a parasitic NPN or PNP bipolar transistor. In that the presence of this parasitic transistor is detrimental to FET performance, various efforts have been employed so as to reduce its gain. An example of such an effort is described in U.S. Pat. No. 4,072,975, INSULATED GATE FIELD EFFECT TRANSISTOR, A. Ishitani, Feb. 7, 1978. In an effort to even more effectively reduce the effects of the parasitic bipolar transistor the configuration of the present invention was conceived. Additionally, the structure of the present invention may provide greater punchthrough protection and lower on-resistance. Furthermore, the invention can yield a device having a threshold voltage which is lower than that of an equivalent device not incorporating the invention.

SUMMARY OF THE INVENTION

A semiconductor wafer includes, in series, source, body and drain regions of alternate conductivity type, such that PN junctions exist between neighboring regions. The length and width of a channel region is defined in the body region at a surface of the wafer by the spacing between the source and drain regions at the wafer surface. The body region further includes a supplementary region of similar conductivity type to the body region. The supplementary region has a relatively high areal dopant concentration and it extends laterally beneath a portion of the channel region. A source electrode is disposed on one surface of the wafer and a drain electrode is disposed on an opposing surface.

DETAILED DESCRIPTION

Figure 1:
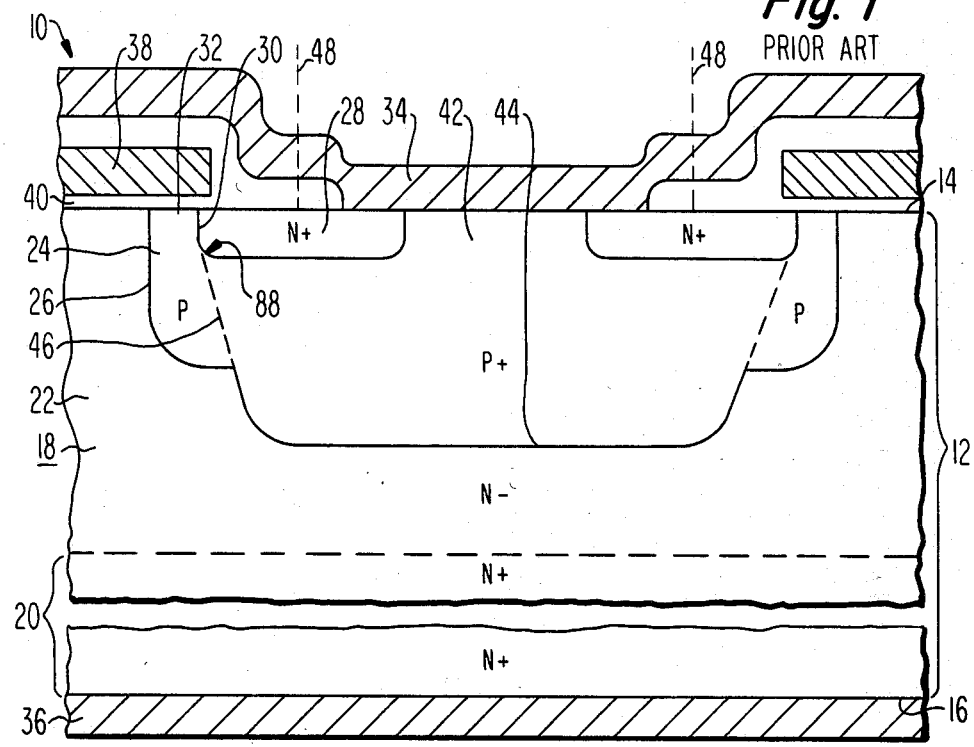
FIG. 1 is a sectional view of a conventional VDMOS device incorporating a conventional means for reducing the parasitic bipolar transistor.

Illustrated in FIG. 1 is a conventional N channel VDMOS device 10. It includes a semiconductor wafer 12 having opposing first and second major surfaces 14 and 16 respectively. An N type drain region 18 is disposed across the second surface 16 and extends to the first surface 14. The drain region 18 typically further comprises a planar N+ type portion 20 contiguous with the second surface 16 and an N− type extended drain portion 22 extending from the planar portion 20 to the surface 14.

Extending into the wafer 12 from the first surface 14 is a body region 24 of P type conductivity which forms a body/drain PN junction 26 at its interface with the extended drain region 22. The body region 24 might be any of a variety of geometric shapes. For example, the body/drain PN junction 26 might intercept the first surface 14 in the shape of a hexagon or square.

Extending into the wafer 12 from the surface 14 within the boundary of the body/drain PN junction 26 is an N+ type source region 28. The source region 28 forms a source/body PN junction 30 at its interface with the body region 24. The spacing between the source/body PN junction 30 and body/drain PN junction 26 at the first surface 14 defines the length of a channel region 32 in the body region 24 at the first surface 14. The source region 28 is ring-shaped (although not necessarily circular) and has a substantially similar shaped periphery (e.g. square or hexagonal) as the body region 24; the periphery being substantially concentric (at the first surface) with the body region 24. A source electrode 34 contacts the source region 28 on the first surface 14, a drain electrode 36 contacts the N+ type portion 20 on the second surface 16, and a gate electrode 38, spaced from the first surface 14 by a gate oxide 40, overlies the channel region 32.

During device operation, the source electrode 34 is typically maintained at ground potential and the drain electrode 36 is maintained at a positive potential which might be, for example, in the 20 to 2000 volt range. So as to initiate a current flow between source and drain, a positive voltage greater than some threshold voltage is applied to the gate electrode 38. Typically the threshold voltage is in the range of approximately 1 to 5 volts.

Although the device 10 operates as a unipolar FET, the series nature of the source, body and drain regions 28, 24, and 18 inherently creates a parasitic NPN bipolar transistor. So as to reduce the effect of this bipolar transistor, the device 10 is provided with a P+ type body region 42 contiguous with the P type body region 24 in which the channel region is formed. The P+ type body region 42 is in ohmic contact with the source electrode 34 at the first surface 14. The presence of the P+ type body region 42 reduces the effect of the parasitic NPN bipolar transistor because it reduces the gain thereof. In an optimal conventional design, the P+ type region 42 extends laterally (i.e. in a direction parallel to the surface 14) as far as possible without extending into the channel region 32, and it is centered in the body region 24.

The P+ type region 42 extends to a depth greater than that of the body region 24 so as to form a P+/N− junction 44 at its interface with the extended drain region 22. A typical range of depths for the body region 24 is from to 2 to 4 microns, and a typical range of depths for the P+ type region 42 is from 4 to 8 microns. The interface between the P+ type region 42 and the body region 24 is represented by a broken line 46 and is commonly referred to as a "high-low junction".

Typically, the P+ type body region is formed by doping and diffusing an appropriate P type dopant through an aperture in a mask on the surface 14. The aperture of such a mask is located such that the high-low junction 46 which is ultimately formed does not extend into the channel region 32. The location of the aperture which determined the location of the P+ type body region 42 in device 10 is shown at 48 in FIG. 1. The region of peak dopant concentration within the P+ type region 42 occurs at or near the surface 14 and is laterally defined by the aperture 48. Dopant concentration decreases monotonically as a function of lateral distance and depth from this region of peak dopant concentration.

Figure 2:
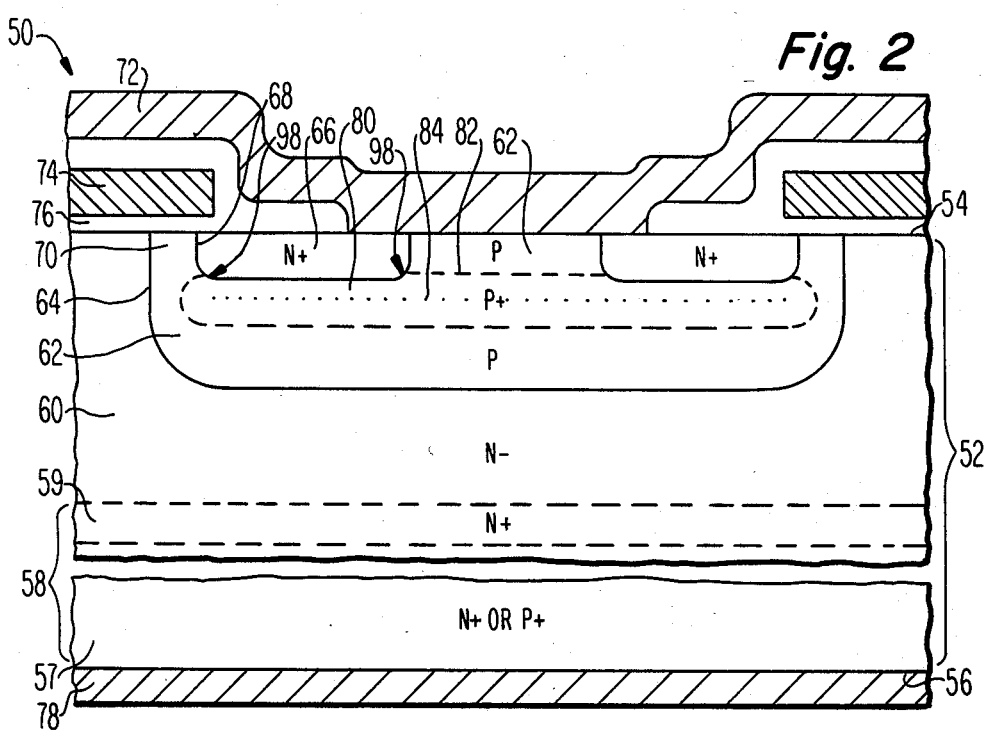
FIGS. 2 and 3 are sectional views of first and second embodiments of the structure of the present invention incorporated in a VDMOS device having either three or four layers.
Figure 3:
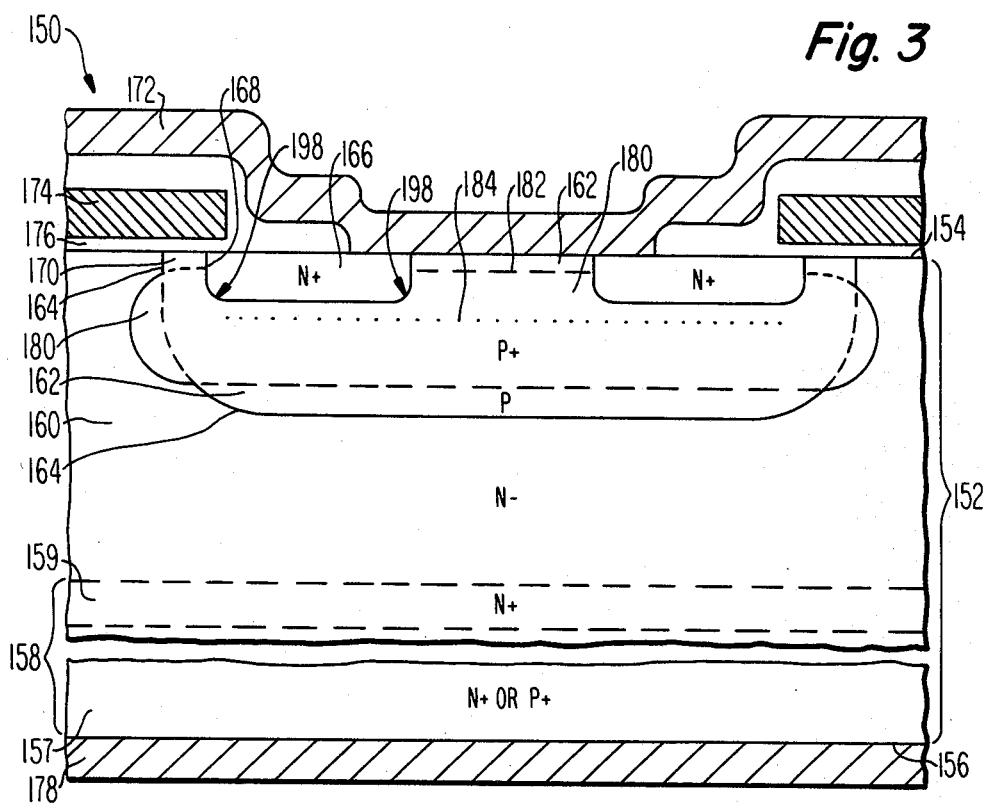

An improvement over the prior art structure is shown in FIGS. 2 and 3, wherein N channel devices 50 and 150, each incorporating the present invention, are illustrated. Portions of device 150 which correspond to portions of device 50 are identified by a similar reference number preceded by the numeral 1. For clarity of description the basic features of both devices will be described with respect to device 50 only, although a similar description applies to the corresponding features of device 150. The distinctions between the devices 50 and 150 are related to the configurations of the supplementary regions 80 and 180, as elaborated upon below.

The device 50 includes a semiconductor wafer 52 having first and second opposing major surfaces 54 and 56 respectively. The present invention is equally suitable to three layer and four layer structures; that portion of the wafer which is adjacent to the second surface 56 is of relatively high conductivity and may be of either N+ type or P+ type material. In a three layer N channel VDMOS device this high conductivity region, identified at 58, is of N+ type material and it is referred to as a high conductivity drain portion. In a four layer N channel VDMOS device the high conductivity region 58 comprises a P+ type region adjacent to the second surface 56; the P+ type region being referred to as an anode region. In the four layer N channel VDMOS structure the P+ type anode region may extend through the entire high conductivity region 58, or the high conductivity region 58 can comprise a P+ type anode region adjacent to the surface 56, as shown at 57, and an overlying N+ type region, as shown at 59. Description of such a four layer (source/body/drain/anode) device, presently referred to as a COMFET (TM of RCA Corporation), can be found in commonly assigned U.S. Pat. No. 4,364,073, POWER MOSFET WITH AN ANODE REGION, H. W. Becke et al., Dec. 14, 1982. It also should be understood that the conductivity types of all regions can be reversed, so as to yield P channel VDMOS devices of three or four layers.

Disposed on the high conductivity portion 58 and extending to the first surface 54 is an N− type extended drain region 60. A P type body region 62 extends into the wafer from the surface 54 and forms a body/drain PN junction 64 with the N− type extended drain region 60. Extending into the wafer within the boundary of the body region 62 is an N+ type source region 66 which forms a source/body PN junction 68 at its interface with the body region 62. The source/body junction 68 is disposed at a predetermined depth from the surface 54 and is spaced from the body/drain junction 64 so as to define the length of a channel region 70 in the body region 62 near the first surface 54.

As with the conventional device 10, the device 50 of the present invention can have a body region of, for example, hexagonal shape, and a hexagonal-ring shaped source region 66 having a periphery which is substantially concentric therewith. However, as will be elaborated upon herein, optimum PN junction depths as well as the conductivities of particular regions may be different in the device 50 compared to the conventional device 10.

On the first surface 54 a source electrode 72 contacts the source region 66, and a gate electrode 74 which overlies a gate insulator 76, overlies the channel region 70. In the preferred embodiment the gate insulator 76 comprises oxide and the source electrode 72 additionally contacts the body region 62. A drain electrode 78 contacts the N+ type or P+ type portion of the high conductivity region 58 on the second wafer surface 56.

As shown in FIG. 2, the device 50 incorporates a supplementary region 80 within the boundary of the body region 62. The supplementary region 80 is of similar conductivity type to the body region 62, but it is of relatively high areal dopant concentration compared to the body region. The interface between the supplementary region 80 and the body region 62 is a high-low junction and it is represented by dashed line 82. Peak dopant concentration within the supplementary region 80 occurs in a region which is disposed at a substantially uniform depth from the first surface 54, as represented by the dotted line 84. This peak dopant concentration region 84 is substantially parallel to the wafer surface 54 and is optimally located at a depth which is substantially equal to or greater than that of the source/body PN junction 68. Dopant concentration within the supplementary region 80 decreases monotonically with distance from the peak concentration region 84.

Importantly, the supplementary region 80 extends laterally beneath a portion of the channel region 70, and it is desirable that this lateral extension underlie as much of the channel region as possible. In an optimum configuration the supplementary region 80 will approach but not infringe upon any portion of the channel region 70. For example, in device 50 the source region 66 might extend to a depth of 0.4 microns from the first surface 54, the maximum depth of the channel region 70 might be 0.1–0.2 microns, the peak concentration region 84 of the supplementary region 80 might occur at a depth of 0.4–0.6 microns, and the high-low junction 82 might extend laterally, beneath the channel region 70, a distance of 0.1–0.5 microns.

In the second embodiment of the invention, as illustrated by device 150 in FIG. 3, the supplementary region 180 is not entirely contained within the boundary of the body region 162. In the device 150 the region of peak dopant concentration 184 is at a substantially similar or deeper depth compared to region 84 in device 50, and the supplementary region 180 extends laterally beneath the entire channel region 70. Additionally, as shown in FIG. 3, the contour of the body/drain PN junction 164 may also have a greater lateral extent in this embodiment.

It should further be understood that within the scope of the invention still other embodiments are possible. For example, a supplementary region can be provided which additionally extends the depth of the body/drain PN junction 64 or 164, and/or which includes a high-low junction 82 or 182 which intercepts the first wafer surface 54 or 154.

In either embodiment, the supplementary region 80 or 180 is formed by ion implantation at an appropriate dosage and voltage so as to yield a peak concentration in the regions identified at 84 or 184. The edge of the gate electrodes 74 or 174 (as well as the edges of the respective underlying and overlying materials) can be used to substantially determine the aperture location of an implantation mask, when this ion implantation is performed. The lateral extent of the supplementary regions 80 and 180 is determined by implantation energy, dosage and species and the extent of subsequent annealing.

In an exemplary processing sequence for a silicon wafer, following the formation of the high conductivity portions 58 or 158 with an N− type layer 60 or 160 thereon, and the formation and definition of the gate insulator 76 or 176 and gate electrode 74 or 174, the P type regions 62 or 162 can be formed by selectively doping the wafer in areas not covered with the gate electrode, gate insulator, and other masking layers, and by subsequently diffusing. Preferably, both the source region 66 or 166 and the supplementary region 80 or 180 are then formed by ion implantation through the same aperture(s) in the gate electrode and gate insulator. The salient features of a typical processing sequence are:
(1) ion implant arsenic (an N type dopant);
(2) anneal and diffuse;
(3) ion implant boron (a P type dopant) relatively deeply;
(4) partially anneal.

An alternative sequence might be:
(1) ion implant boron relatively deeply;
(2) anneal and diffuse;
(3) ion implant arsenic;
(4) anneal.

The indicated boron and arsenic dopant species are chosen because boron diffuses at a significantly faster rate than arsenic. Additionally, boron is selected for its relatively high penetration depth (i.e. its "projected range") during ion implantation. Associated with this projected range is a lateral spreading of the implanted dose beyond the dimensions of the mask aperture through which the implantation was made. Peak concentration of the boron should be in the approximate $10^{18}$ to $10^{20}$ cm$^{-3}$ range.

Either of the disclosed sequences will produce a structure wherein the lateral diffusion of the P type dopant will be greater than that of the N type dopant. Since both the source region and supplementary region implantations are performed through the same aperture(s), they will automatically be aligned with respect to each other. It should be further noted that one can deliberately choose to not fully anneal following the boron implantation, in either sequence. If this is done, the crystallographic damage that remains can serve to further reduce carrier lifetime and mobility in the supplementary regions 80 and 180, and will serve to further reduce the gain of the parasitic bipolar transistor.

The devices 50 and 150 provide more effective suppression of the parasitic bipolar transistor than conventional devices because a P+ type portion of the body region is located closer to and underneath a portion of the channel region. Additionally, the specific location of the supplementary regions 80 and 180 provides greater punchthrough protection for the devices. Punchthrough, a well recognized and undesirable phenomenon, tends to occur at the portion of the source/body PN junctions having the smallest radius of curvature. In FIG. 1, the areas of small radius of curvature of the source/body PN junction 30 are labeled as 88. In FIGS. 2 and 3, the areas of small radius of curvature are labeled as 98 and 198 respectively. These areas 88, 98 and 198 occur near the deepest portions of the source regions 28, 66 and 166.

Punchthrough voltage is determined by the P type concentration (in an NPN structure) adjacent to the small radius of curvature areas. In devices 50 and 150, the presence of the P+ type supplementary regions 80 and 180 at these areas reduces the likelihood of punchthrough at these areas, i.e. the voltage at which punchthrough will occur is increased. Furthermore, we hypothesize that in the devices 50 and 150 the punchthrough voltage has little if any dependence on the P type concentration in the body regions 62 and 162, since this relatively low conductivity portion of the respective body regions is no longer adjacent to the small radius of curvature portions of the source region.

In the conventional device 10 the P type concentration in the body region 24 has to be maintained at a certain level so as to provide a punchthrough voltage greater than the source-to-drain breakdown voltage. In the device 50 of the present invention this constraint is no longer present. The present invention therefore permits the P type concentration in the body region to be reduced in the channel regions 70 and 170, thereby permitting a lower threshold voltage without sacrificing punch-through susceptibility.

Another potential advantage of the present invention exists at the source electrode contact with the source region. Whereas in the conventional device 10 a portion of the source region 28 is counterdoped with P type impurities when the P+ type body region 42 is formed, this counterdoping is not present in the source regions 66 and 166 of the present invention. Thus, the resistance of the contact between source electrode 72 or 172 and the respective source region 66 or 166 in the devices 50 and 150 should be lower than the contact resistance between the source electrode 34 and the source region 28 in the device 10.

It should also be noted that the present invention can optionally be incorporated into device 10, so as to form a device with both a conventional P+ type body region 42 and a supplementary P+ type region 80 or 180. Although such a structure would not provide the indicated reduced source electrode contact resistance, it would still provide superior suppression of the parasitic bipolar transistor, enhanced punchthrough protection, and the possibility of a reduced threshold voltage.

When the invention is incorporated in a P channel VDMOS device it is recommended that boron be used as the P type source region dopant and phosphorous be used as the N type supplementary region dopant. Although these two dopant species have similar diffusion rates, phosphorous can be implanted with a greater projected range, so as to yield the desired structure, if appropriate implantation equipment and parameters are used.

What is claimed is:

1. In a method for fabricating a VDMOS device including the steps of providing a semiconductor wafer having a drain region of first conductivity type adjacent to a surface thereof, forming an apertured mask on said surface, diffusing a second conductivity type dopant into the wafer through a mask aperture so as to form a body region and a body/drain PN junction, and diffusing a first conductivity type dopant into the wafer through said mask aperture so as to form a source region and a source/body PN junction, the source/body PN junction extending to a predetermined depth from said wafer surface and being spaced from the body/drain PN junction so as to define a channel region at said surface, the improvement comprising:

implanting a supplementary dopant of second conductivity type into the wafer through said aperture, and subsequently annealing said wafer, so as to create a supplementary region of relatively high areal dopant concentration; said supplementary region extending beneath at least a portion of said channel region.

2. A method in accordance with claim 1, comprising implanting said supplementary dopant such that peak dopant concentration within the supplementary region occurs adjacent to the source/body PN junction at said predetermined depth.

3. A method in accordance with claim 1, wherein said apertured mask comprises an insulated gate electrode.

4. A method in accordance with claim 1, wherein the diffusion rate of said supplementary dopant of second conductivity type is faster than the diffusion rate of said first conductivity type dopant.

5. A method in accordance with claim 1, wherein the projected range of said supplementary dopant of second conductivity type is greater than that of said first conductivity type dopant.

6. A method for fabricating an N channel device, comprising a method in accordance with claim 1, wherein said semiconductor wafer is silicon, said supplementary dopant of second conductivity type is boron and said first conductivity type dopant is arsenic.

7. A method for fabricating a P channel device, comprising a method in accordance with claim 1, wherein said semiconductor wafer is silicon, said supplementary dopant of second conductivity type is phosphorous and said first conductivity type dopant is boron.

* * * * *